US012747982B2

(12) United States Patent
Nishida et al.

(10) Patent No.: US 12,747,982 B2
(45) Date of Patent: Sep. 29, 2026

(54) OPTICAL SENSOR

(71) Applicant: LITE-ON SINGAPORE PTE. LTD., Singapore (SG)

(72) Inventors: Yoshio Nishida, Singapore (SG); Seng-Yee Chua, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 79 days.

(21) Appl. No.: 18/910,114

(22) Filed: Oct. 9, 2024

(65) Prior Publication Data

US 2025/0130104 A1 Apr. 24, 2025

(30) Foreign Application Priority Data

Oct. 23, 2023 (SG) ........................... 10202302989V

(51) Int. Cl.
*G01J 1/44* (2006.01)
*G01R 19/10* (2006.01)

(52) U.S. Cl.
CPC ................ *G01J 1/44* (2013.01); *G01R 19/10* (2013.01); *G01J 2001/446* (2013.01)

(58) Field of Classification Search
CPC .......... G01J 1/44; G01J 2001/446; G01J 1/46; G01R 19/10; H03K 19/017545
See application file for complete search history.

(56) References Cited

U.S. PATENT DOCUMENTS

2001/0040212 A1* 11/2001 Mizuno ................ G06G 7/1865 250/214 R
2017/0360315 A1 12/2017 Pi et al.

FOREIGN PATENT DOCUMENTS

EP 3745103 B1 * 5/2023 ......... A61B 5/14552

* cited by examiner

*Primary Examiner* — Tony Ko
(74) *Attorney, Agent, or Firm* — Li & Cai Intellectual Property (USA) Office

(57) ABSTRACT

An optical sensor is provided. The optical sensor includes a photodiode and a differential current integrator. The differential current integrator includes a first input terminal, a second input terminal, a first output terminal and a second output terminal. The first input terminal of the differential current integrator is connected to the photodiode. The second input terminal of the differential current integrator is coupled to a first reference voltage.

19 Claims, 8 Drawing Sheets

OPTICAL SENSOR

CROSS-REFERENCE TO RELATED PATENT APPLICATION

This application claims the benefit of priority to Singapore Patent application No. 10202302989V, filed on Oct. 23, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor, and more particularly to an optical sensor.

BACKGROUND OF THE DISCLOSURE

Optical sensors such as proximity sensors and ambient light sensors sense a light and convert it into electrical signals and then the electrical signals are processed by other circuit components. However, conventional optical sensors are unable to accurately sense light irradiated on the conventional optical sensors.

SUMMARY OF THE DISCLOSURE

In response to the above-referenced technical inadequacies, the present disclosure provides an optical sensor. The optical sensor includes a photodiode and a differential current integrator. The differential current integrator includes a first input terminal, a second input terminal, a first output terminal and a second output terminal. The first input terminal of the differential current integrator is connected to the photodiode. The second input terminal of the differential current integrator is coupled to a first reference voltage.

As described above, the present disclosure provides the optical sensor. The optical sensor of the present disclosure is capable of sensing light to generate the positive output voltage signal and the negative output voltage signal in order to suppress common-mode noise introduced in the first and second output terminals of the differential current integrator. The optical sensor of the present disclosure includes the two output terminals respectively for outputting the positive output voltage signal and the negative output voltage signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
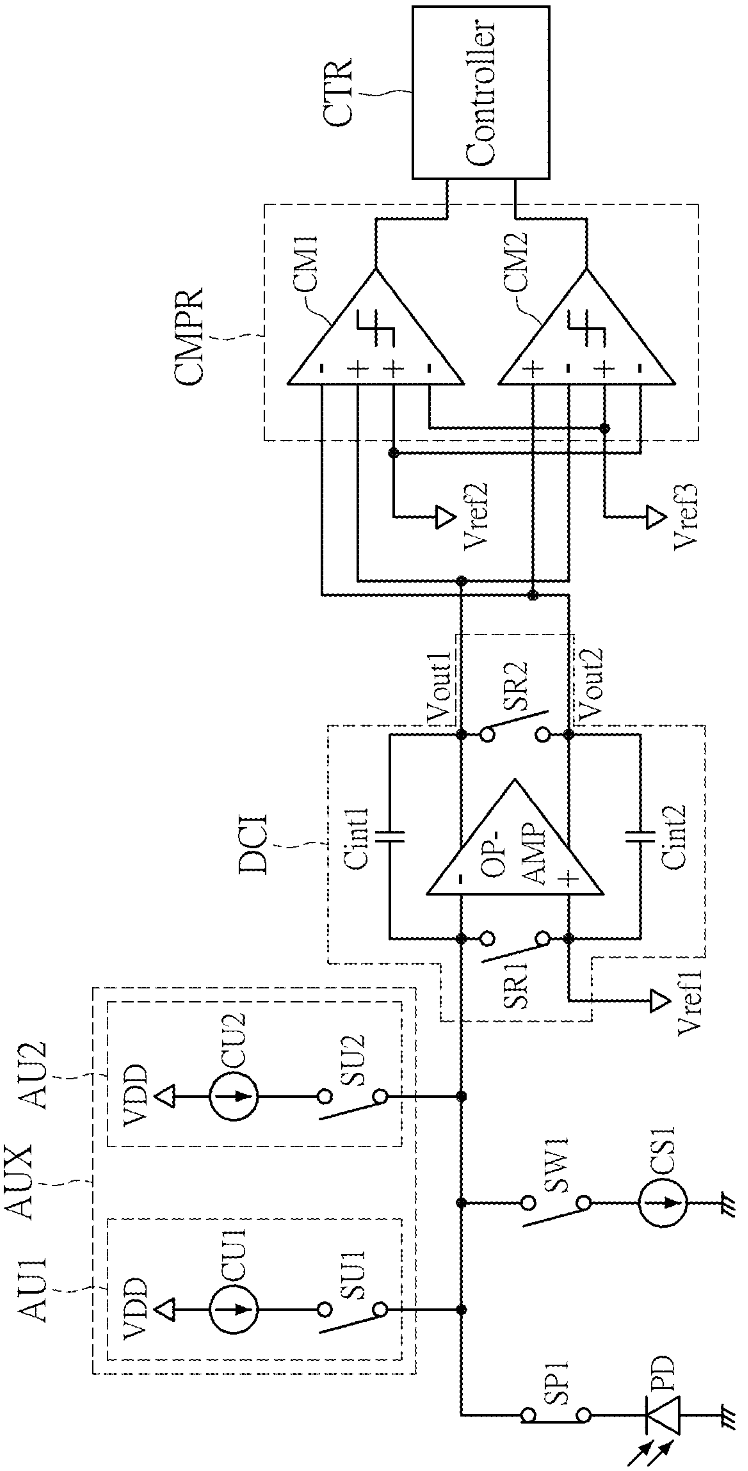
FIG. 1 is a circuit diagram of an optical sensor according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 1 is a circuit diagram of an optical sensor according to a first embodiment of the present disclosure.

As shown in FIG. 1, the optical sensor may include a photodiode PD and a differential current integrator DCI. The differential current integrator DCI may include a first input terminal, a second input terminal, a first output terminal and a second output terminal. The first input terminal of the differential current integrator DCI may be connected to the photodiode PD. The second input terminal of the differential current integrator DCI may be coupled to a first reference voltage Vref1. The optical sensor may further include a photodiode current switch SP1, a first switch SW1, a switch circuit AUX, a comparator circuit CMPR and a controller CTR.

The anode of the photodiode PD may be grounded. The cathode of the photodiode PD is connected to a first terminal of the photodiode current switch SP1. The photodiode current switch SP1 is a switch.

The photodiode PD converts energy of light irradiated on the photodiode PD into a photocurrent.

The differential current integrator DCI may include an operational amplifier OP-AMP. The operational amplifier OP-AMP may have an inverting input terminal (denoted with a negative "−" sign), a non-inverting input terminal (denoted with a positive "+" sign), a first output terminal and a second output terminal. The inverting input terminal may be connected to the first input terminal of the differential current integrator DCI. The non-inverting input terminal may be connected to the second input terminal of the differential current integrator DCI. The first output terminal of the operational amplifier OP-AMP may be connected to the first output terminal of the differential current integrator DCI. The second output terminal of the operational amplifier OP-AMP may be connected to the second output terminal of the differential current integrator DCI.

The differential current integrator DCI may output a first output voltage signal Vout1 on the first output terminal of the differential current integrator DCI. The differential current integrator DCI may output a second output voltage signal Vout2 on the second output terminal of the differential current integrator DCI.

The first input terminal of the differential current integrator DCI may be connected to a second terminal of the photodiode current switch SP1. That is, the photodiode current switch SP1 may be connected between the photodiode PD and the first input terminal of the differential current integrator DCI.

In practice, the photodiode current switch SP1, the first switch SW1, the first power switch SU1 and the second power switch SU2 may respectively have third terminals as control terminals connected to the controller CTR or an external controller (not shown in figures), and may be controlled by the controller CTR or the external controller.

The differential current integrator DCI may further comprise a first integrating capacitor Cint1 and a second integrating capacitor Cint2. The first integrating capacitor Cint1 may be connected between the first input terminal and the first output terminal of the differential current integrator DCI. For example, a first terminal of the first integrating capacitor Cint1 may be connected to the inverting input terminal of the operational amplifier OP-AMP. A second terminal of the first integrating capacitor Cint1 may be connected to the first output terminal of the operational amplifier OP-AMP.

The second integrating capacitor Cint2 may be connected between the second input terminal and the second output terminal of the differential current integrator DCI. For example, a first terminal of the second integrating capacitor Cint2 may be connected to the non-inverting input terminal of the operational amplifier OP-AMP. A second terminal of the second integrating capacitor Cint2 may be connected to the second output terminal of the operational amplifier OP-AMP.

The optical sensor may further include a first current source CS1. The first current source CS1 may be connected to the differential current integrator DCI. In some embodiments, the first current source CS1 may be connected to the first input terminal of the differential current integrator DCI. In some embodiments, the first current source CS1 may be connected to the second input terminal of the differential current integrator DCI.

The first switch SW1 may be connected between the first current source CS1 and the first input terminal of the differential current integrator DCI. For example, a first terminal of the first switch SW1 may be connected to the inverting input terminal of the operational amplifier OP-AMP. A second terminal of the first switch SW1 may be connected to a first terminal of the first current source CS1, and a second terminal of the first current source CS1 may be grounded.

The switch circuit AUX may include one or more sub-switch circuits such as, but not limited to a first sub-switch circuit AU1 and a second sub-switch circuit AU2. The first sub-switch circuit AU1 may include a first input current source CU1 and a first power switch SU1. The second sub-switch circuit AU2 may include a second input current source CU2 and a second power switch SU2, but the present disclosure is not limited thereto.

A first terminal of the first input current source CU1 is coupled to a common voltage VDD. A second terminal of the first input current source CU1 is connected to a first terminal of the first power switch SU1. A second terminal of the first power switch SU1 is connected to the first input terminal of the differential current integrator DCI. When the first power switch SU1 is turned on, a first supply current supplied by the first input current source CU1 flows to the first input terminal of the differential current integrator DCI through the first power switch SU1.

A first terminal of the second input current source CU2 is coupled to the common voltage VDD. A second terminal of the second input current source CU2 is connected to a first terminal of the second power switch SU2. A second terminal of the second power switch SU2 is connected to the first input terminal of the differential current integrator DCI. When the second power switch SU2 is turned on, a second supply current supplied by the second input current source CU2 flows to the first input terminal of the differential current integrator DCI through the first power switch SU2.

The differential current integrator DCI may further include a first reset switch SR1 and a second reset switch SR2. The first reset switch SR1 and the second reset switch SR2 achieve resetting of voltages of the differential current integrator DCI.

A first terminal of the first reset switch SR1 is connected to the first input terminal of the differential current integrator DCI. A second terminal of the first reset switch SR1 is connected to the second input terminal of the differential current integrator DCI.

A first terminal of the second reset switch SR2 is connected to the first output terminal of the differential current integrator DCI. A second terminal of the second reset switch SR2 is connected to the second output terminal of the differential current integrator DCI. The first reset switch SR1 and the second reset switch SR2 may have third terminals as control terminals connected to the controller CTR or an external controller, and may be controlled by the controller CTR or the external controller.

When the first reset switch SR1 and the second reset switch SR2 are turned on, the first input terminal and the second input terminal of the differential current integrator DCI are set to have the same voltage, and the first output terminal and the second output terminal of the differential current integrator DCI are set to have another same voltage. In FIG. 1, when the first reset switch SR1 and the second reset switch SR2 are turned on, the voltages of the first input terminal and second input terminal of the differential current integrator DCI are reset to be equal to the first reference voltage Vref1. The first reference voltage Vref1 may be a low voltage or a zero voltage.

The comparator circuit CMPR is connected to the first output terminal and the second output terminal of the differential current integrator DCI. The comparator circuit CMPR may include two fully differential comparators such as a first voltage comparator CM1 and a second voltage comparator CM2, but the present disclosure is not limited thereto.

The first voltage comparator CM1 may have a first input terminal (such as an inverting input terminal), a second input terminal (such as a non-inverting input terminal), a third input terminal (such as a non-inverting input terminal) and a fourth input terminal (such as an inverting input terminal), but the present disclosure is not limited thereto.

The first input terminal of the first voltage comparator CM1 is connected to the second output terminal of the differential current integrator DCI. The second input terminal of the first voltage comparator CM1 is connected to the first output terminal of the differential current integrator DCI. The third input terminal of the first voltage comparator CM1 is coupled to a second reference voltage Vref2. The fourth input terminal of the first voltage comparator CM1 is coupled to a third reference voltage Vref3.

The second voltage comparator CM2 may have a first input terminal (such as a non-inverting input terminal), a second input terminal (such as an inverting input terminal), a third input terminal (such as a non-inverting input terminal) and a fourth input terminal (such as an inverting input terminal), but the present disclosure is not limited thereto. The first input terminal of the second voltage comparator CM2 is connected to the second output terminal of the differential current integrator DCI. The second input terminal of the second voltage comparator CM2 is connected to the first output terminal of the differential current integrator DCI. The third input terminal of the second voltage comparator CM2 is coupled to the third reference voltage Vref3. The fourth input terminal of the second voltage comparator CM2 is coupled to the second reference voltage Vref2. An output terminal of the first voltage comparator CM1 and an output terminal of the second voltage comparator CM2 are connected to the controller CTR.

Figure 2:
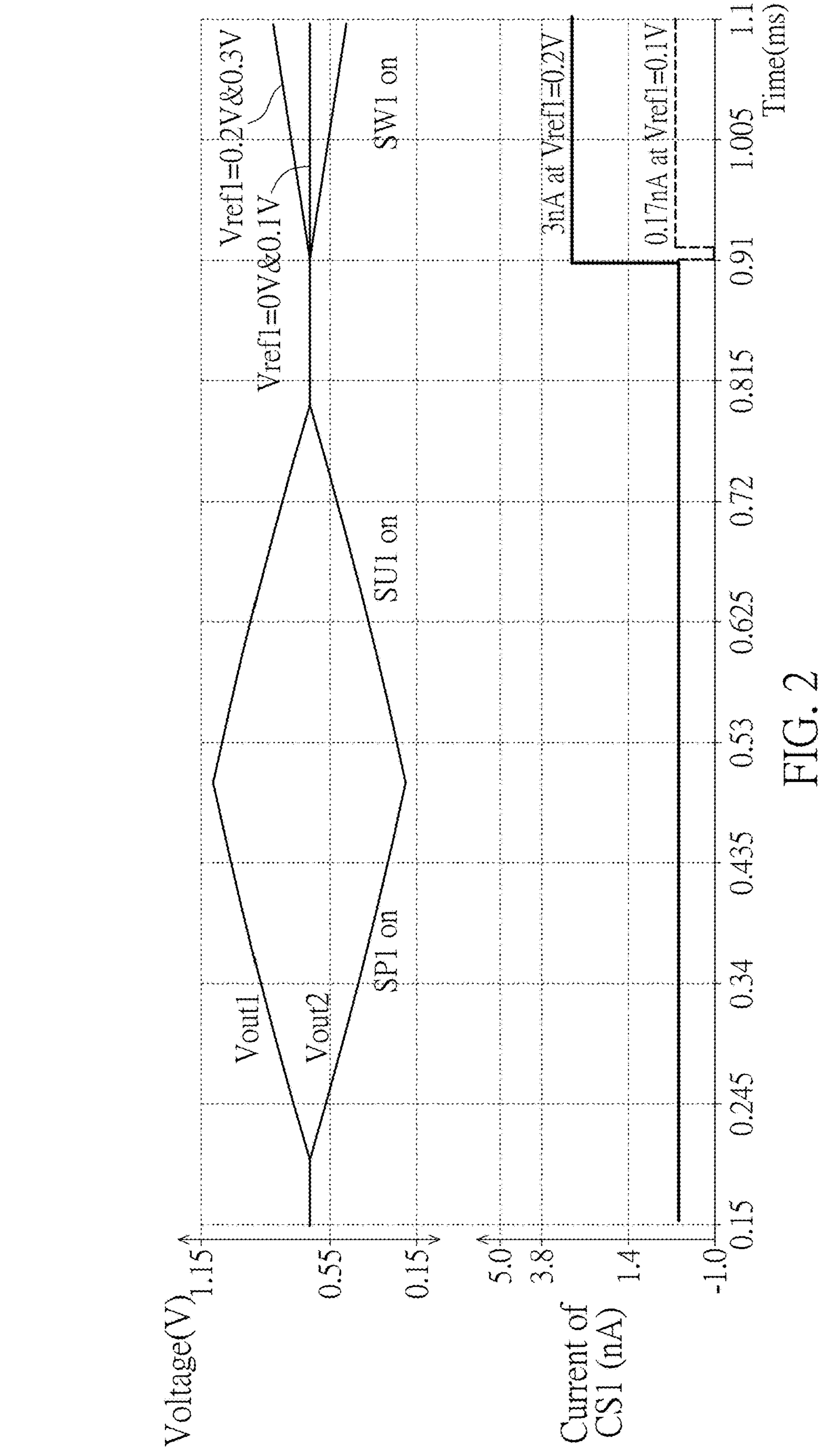
FIG. 2 illustrates examples of signal waveforms of the optical sensor according to the first embodiment of the present disclosure.

FIG. 2 illustrates examples of signal waveforms of the optical sensor according to the first embodiment of the present disclosure. As shown in FIG. 2, when the photodiode current switch SP1 is turned on (by the controller CTR or the external controller), the first output voltage signal Vout1 is gradually increased and the second output voltage signal Vout2 is gradually decreased.

The first output voltage signal Vout1 may be calculated by using an equation of:

$$Vout1 = Vcm + \frac{1}{CT1}\int Iph\ dt,$$

wherein Vout1 is the first output voltage signal, Vcm is a common mode voltage, CT1 is the capacitance of the first integrating capacitor Cint1, and Iph is the current generated by the photodiode PD.

The second output voltage signal Vout2 may be calculated by using an equation of:

$$Vout2 = Vcm - \frac{1}{CT2}\int Iph\ dt,$$

wherein Vout2 is the second output voltage signal, Vcm is the common mode voltage, CT2 is the capacitance of the second integrating capacitor Cint2, and Iph is the current generated by the photodiode PD. In some embodiments, the capacitance CT1 of the first integrating capacitor Cint1 and the capacitance CT2 of the second integrating capacitor Cint2 are equal, such that CT1=CT2=CT, and the first integrating capacitor Cint1 and the second integrating capacitor Cint2 have a capacitance CT.

When the first reset switch SR1 and the second reset switch SR2 are turned on (by the controller CTR shown in FIG. 1 or the external controller), the first output voltage signal Vout1 and the second output voltage signal Vout2 are reset to be equal. At this time, the first output voltage signal Vout1 is equal to the second output voltage signal Vout2.

The first voltage comparator CM1 of the comparator circuit CMPR may compare a first voltage difference between the first output voltage signal Vout1 and the second output voltage signal Vout2 with a second voltage difference between the second reference voltage Vref2 and the third reference voltage Vref3 to output a first comparison signal.

The second output voltage signal Vout2 may be subtracted from the first output voltage signal Vout1 to obtain the first voltage difference Vd1, which is represented by an equation of:

$$Vd1 = Vout1 - Vout2 = 2 \times \frac{1}{CT}\int Iph\ dt,$$

wherein Vd1 is the first voltage difference, Vout1 is the first output voltage signal, Vout2 is the second output voltage signal, CT is the capacitance of the first integrating capacitor Cint1 or the second integrating capacitor Cint2, and Iph is the current generated by the photodiode PD.

The second reference voltage Vref2 may be higher than the third reference voltage Vref3. The third reference voltage Vref3 may be subtracted from the second reference voltage Vref2 to obtain the second voltage difference Vd2, which is calculated by using an equation of:

$$Vd2 = Vref2 - Vref3,$$

wherein Vd2 is the second voltage difference, Vref2 is the second reference voltage, and Vref3 is the third reference voltage.

For example, when the first voltage difference Vd1 is higher than the second voltage difference Vd2, the first voltage comparator CM1 outputs the first comparison signal at a high level. Conversely, when the first voltage difference Vd1 is lower than the second voltage difference Vd2, the first voltage comparator CM1 outputs the first comparison signal at a low level.

The second voltage comparator CM2 of the comparator circuit CMPR may compare a third voltage difference between the first output voltage signal Vout1 and the second output voltage signal Vout2 with a fourth voltage difference between the second reference voltage Vref2 and the third reference voltage Vref3 to output a second comparison signal.

The first output voltage signal Vout1 may be subtracted from the second output voltage signal Vout2 to obtain the third voltage difference Vd3, which is represented by an equation of:

$$Vd3 = Vout2 - Vout1 = -2 \times \frac{1}{CT} \int Iph\, dt,$$

wherein Vd3 is the third voltage difference, Vout2 is the second output voltage signal, Vout1 represents the first output voltage signal, CT is the capacitance of the first integrating capacitor Cint1 or the second integrating capacitor Cint2, and Iph is the current generated by the photodiode PD.

The second reference voltage Vref2 may be subtracted from the third reference voltage Vref3 to obtain the fourth voltage difference Vd4, which is calculated by using an equation of:

$$Vd4 = Vref3 - Vref2,$$

wherein Vd4 is the fourth voltage difference, Vref3 is the third reference voltage, and Vref2 is the second reference voltage.

For example, when the third voltage difference Vd3 is higher than the fourth voltage difference Vd4, the second voltage comparator CM2 outputs the second comparison signal at a high level. Conversely, when the third voltage difference Vd3 is lower than the fourth voltage difference Vd4, the second voltage comparator CM2 outputs the second comparison signal at a low level.

After the photodiode current switch SP1 is turned on for periods of time (by the controller CTR shown in FIG. 1 or the external controller) to measure the current generated by the photodiode PD, the photodiode current switch SP1 is turned off and the first power switch SU1 is turned on (by the controller CTR shown in FIG. 1 or the external controller) as shown in FIG. 2. As a result, the first output voltage signal Vout1 is gradually decreased and the second output voltage signal Vout2 is gradually increased.

As shown in FIG. 2, after the first power switch SU1 is turned off (by the controller CTR shown in FIG. 1 or the external controller), the first switch SW1 is turned on (by the controller CTR shown in FIG. 1 or the external controller). Thus, current flows from the first input terminal of the differential current integrator DCI through the first current source CS1 to ground. In other words, current flows from the differential current integrator DCI. Turning on the first switch SW1 allows flow of current through the first current source CS1 and adjusting an initial value of the first output voltage signal Vout1 and the second output voltage signal Vout2. Once the first output voltage signal Vout1 and the second output voltage signal Vout2 are adjusted to the required initial value, the optical sensor may proceed with the next measurement of the current generated by the photodiode PD.

The current of the first current source CS1 may change according to the first reference voltage Vref1. For example, the first reference voltage Vref1 may be changed within a range of 0V to 0.3V. For example, if the first reference voltage Vref1 is in the range between 0.2V and 0.3V, the first current source CS1 may supply a current of 3 nA, which is an expected value. If the first reference voltage Vref1 is 0.1V, the first current source CS1 may supply a current of 0.17 nA, which is much lower than the expected value. Thus, in some embodiments, the first reference voltage Vref1 may be greater than or equal to 0.2V.

The controller CTR may receive and store the first comparison signal from the output terminal of the first voltage comparator CM1 and the second comparison signal from the output terminal of the second voltage comparator CM2. The controller CTR or the external controller (not shown in figures) may control operations of the photodiode current switch SP1, the first switch SW1, the first power switch SU1, the second power switch SU2, the first reset switch SR1 and the second reset switch SR2 according to the first comparison signal and the second comparison signal.

Figure 3:
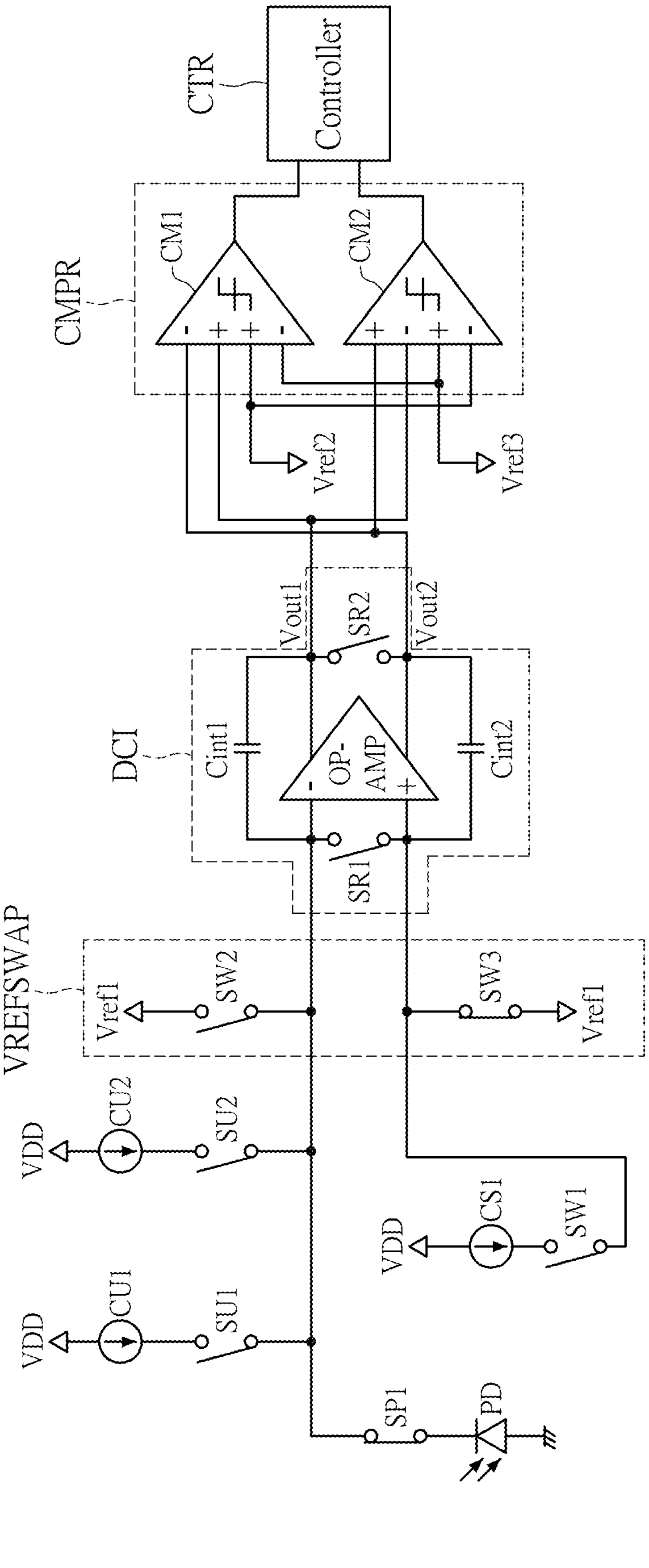
FIG. 3 is a circuit diagram of an optical sensor according to a second embodiment of the present disclosure.

FIG. 3 is a circuit diagram of an optical sensor according to a second embodiment of the present disclosure. The descriptions of the second embodiment of the present disclosure that are the same as the descriptions of the first embodiment of the present disclosure are not repeated herein.

A difference between the first embodiment and the second embodiment of the present disclosure is that, the optical sensor of the second embodiment includes a reference voltage swapping circuit VREFSWAP. FIG. 3 shows that the common voltage VDD may supply the current for the first current source CS1, the first input current source CU1 and the second input current source CU2. Another difference is that, when the first switch SW1 is turned on, the current flows from the common voltage VDD through the first current source CS1 to the second input terminal of the differential current integrator DCI. In other words, current flows to the differential current integrator DCI.

As shown in FIG. 3, the reference voltage swapping circuit VREFSWAP includes a second switch SW2 and a third switch SW3. The first switch SW1 is connected between the first current source CS1 and the second input terminal of the differential current integrator DCI. The second switch SW2 is connected between the first reference voltage Vref1 and the first input terminal of the differential current integrator DCI. The third switch SW3 is connected between the first reference voltage Vref1 and the second input terminal of the differential current integrator DCI.

In detail, the first terminal of the first current source CS1 is coupled to the common voltage VDD or connected to a positive terminal of an input power source which supplies the common voltage VDD.

The second terminal of the first current source CS1 is connected to the first terminal of the first switch SW1. The second terminal of the first switch SW1 is connected to the second input terminal of the differential current integrator DCI.

A first terminal of the second switch SW2 is coupled to the first reference voltage Vref1. A second terminal of the second switch SW2 is connected to the first input terminal of the differential current integrator DCI. A first terminal of the third switch SW3 is coupled to the second input terminal of the differential current integrator DCI. A second terminal of the third switch SW3 is coupled to the first reference voltage Vref1. The second switch SW2 and the third switch SW3 may have third terminals as control terminals connected to the controller CTR or an external controller, and may be controlled by the controller CTR or the external controller.

As shown in FIG. 3, the first switch SW1 and the second switch SW2 may be turned off, and the third switch SW3 may be turned on. Thus, the first current source CS1 may not be able to supply a current, and the first reference voltage Vref1 may be coupled to the second input terminal of the differential current integrator DCI through the third switch SW3.

Figure 4:
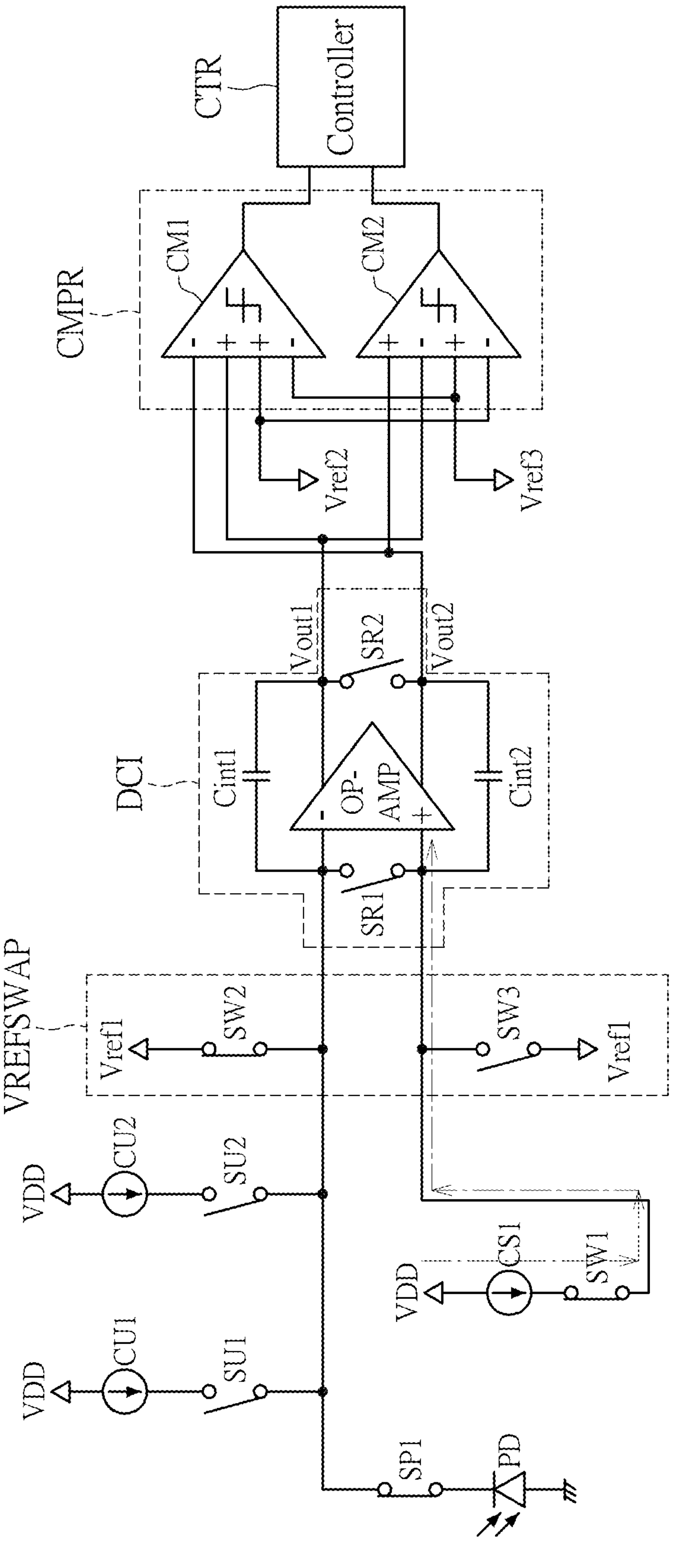
FIG. 4 is a schematic diagram of flowing of currents of the optical sensor according to the second embodiment of the present disclosure.

FIG. 4 is a schematic diagram of flowing of currents of the optical sensor according to the second embodiment of the present disclosure. As shown in FIG. 4, when the first switch SW1 is turned on, a current supplied by the first current source CS1 flows through the first switch SW1 to the second input terminal of the differential current integrator DCI.

In the reference voltage swapping circuit VREFSWAP, the second switch SW2 and the third switch SW3 may be alternatively turned on for supplying the first reference voltage Vref1 alternatively to the first input terminal of the differential current integrator DCI and the second input terminal of the differential current integrator DCI. Alternatively turning on the second switch SW2 and the third switch SW3 may also be performed if there is a requirement or need for the first current source CS1 to supply current. For example, the first switch SW1 and the second switch SW2 may be turned on, and the third switch SW3 may be turned off.

Figure 5:
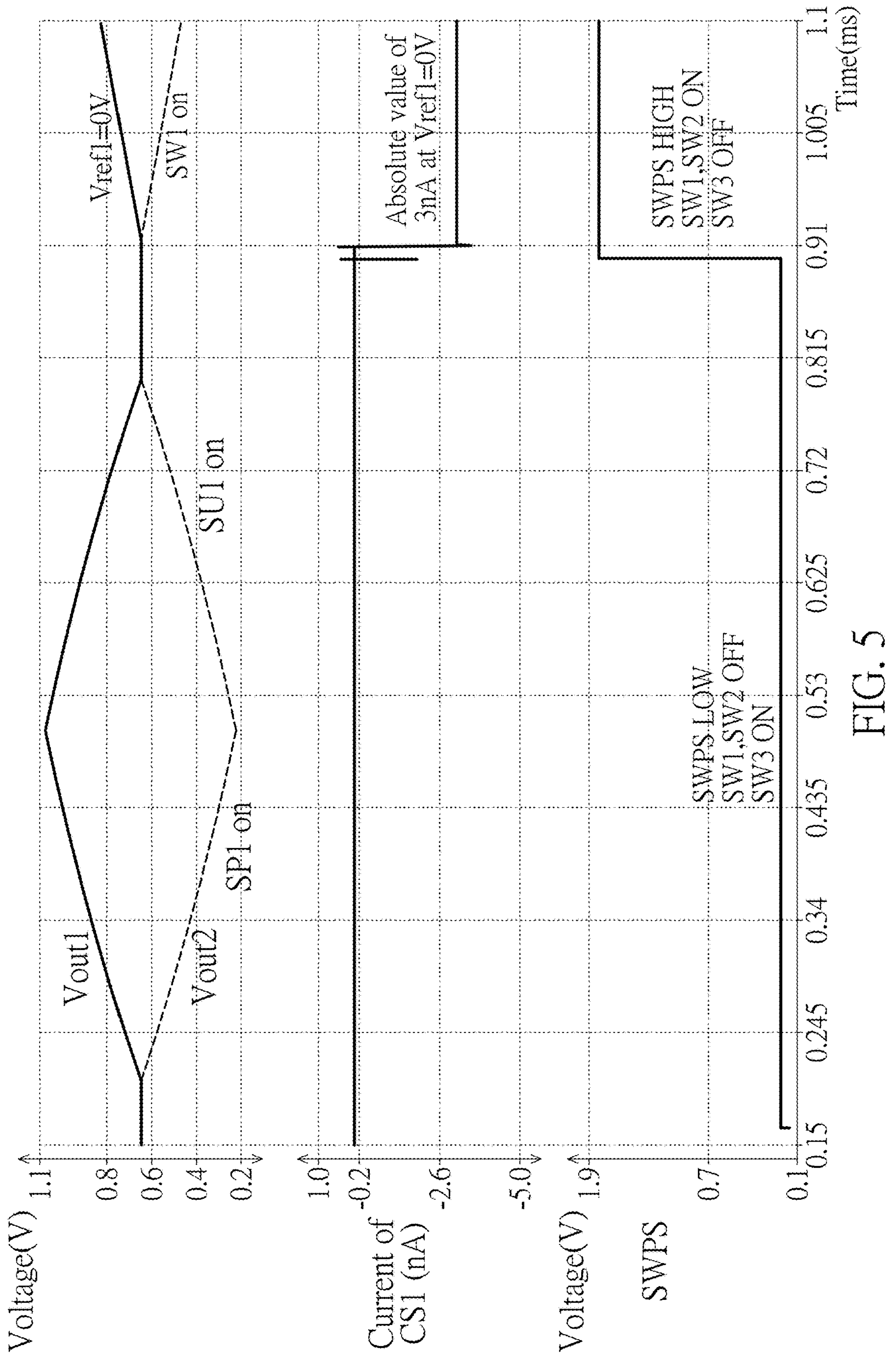
FIG. 5 illustrates examples of signal waveforms of the optical sensor according to the second embodiment of the present disclosure.

FIG. 5 is a waveform diagram of signals of the optical sensor according to the second embodiment of the present disclosure. As shown in FIG. 5, when a reference voltage swapping instruction signal SWPS has a low voltage, the first switch SW1 and the second switch SW2 may be turned off, and the third switch SW3 may be turned on. Thus, the first current source CS1 is not able to supply a current, the current of the first current source CS1 is zero, and the first reference voltage Vref1 is coupled to the second input terminal of the differential current integrator DCI through the third switch SW3. When the reference voltage swapping instruction signal SWPS has a high voltage, the first switch SW1 and the second switch SW2 may be turned on, and the third switch SW3 may be turned off. Thus, the first current source CS1 may supply a current, and the first reference voltage Vref1 is coupled to the first input terminal of the differential current integrator DCI through the second switch SW2. In some embodiments, the first reference voltage Vref1 may be zero. In other words, the node of the first reference voltage Vref1 may be connected to ground. As shown in FIG. 5, the first current source CS1 supplies a current of 3 nA, which is an expected current. Thus, the first current source CS1 works properly if the first reference voltage Vref1 is a low voltage.

Figure 6:
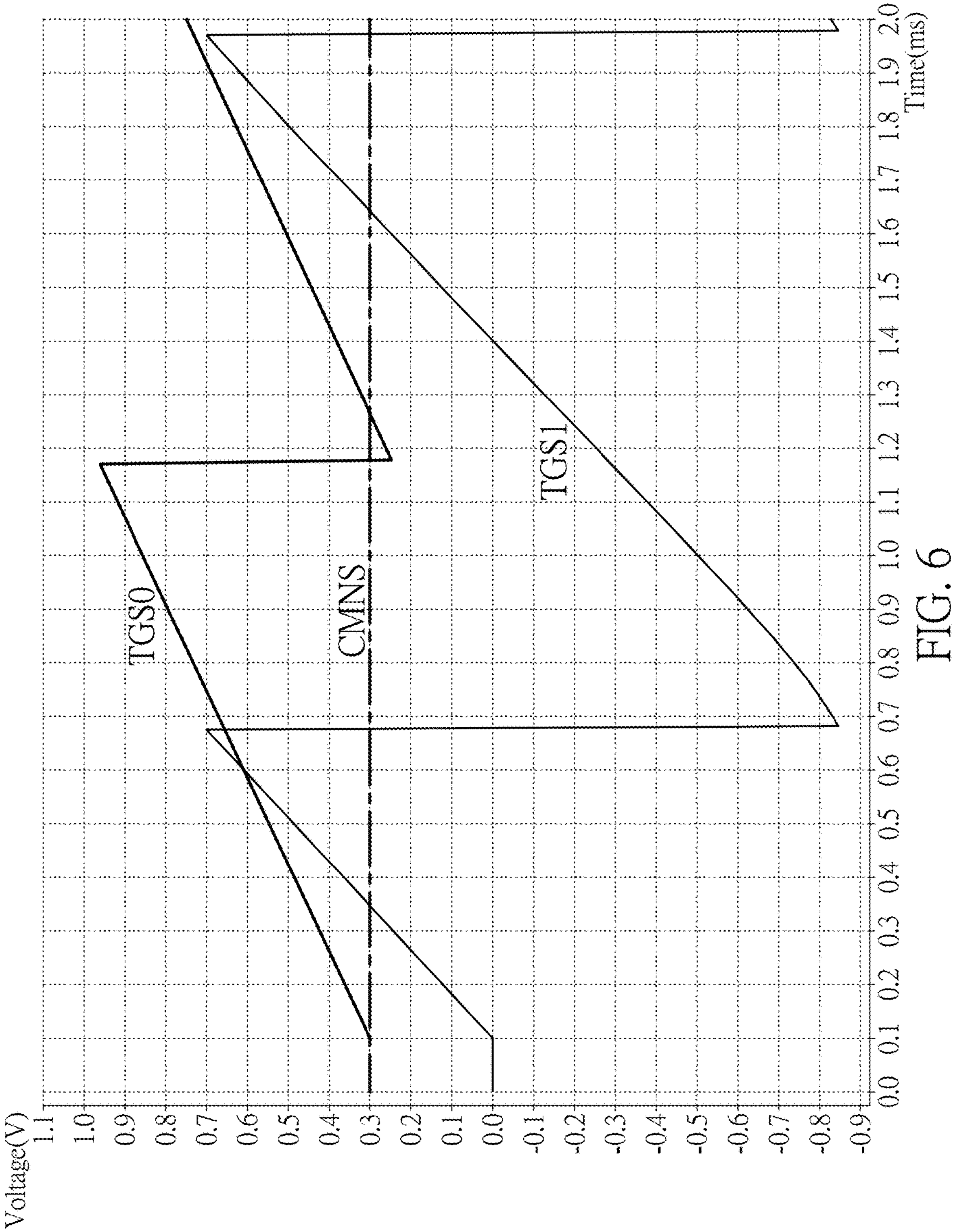
FIG. 6 and FIG. 6A illustrate examples of voltage waveforms of the optical sensor of the first and second embodiments of the present disclosure and a conventional optical sensor.
Figure 6A:
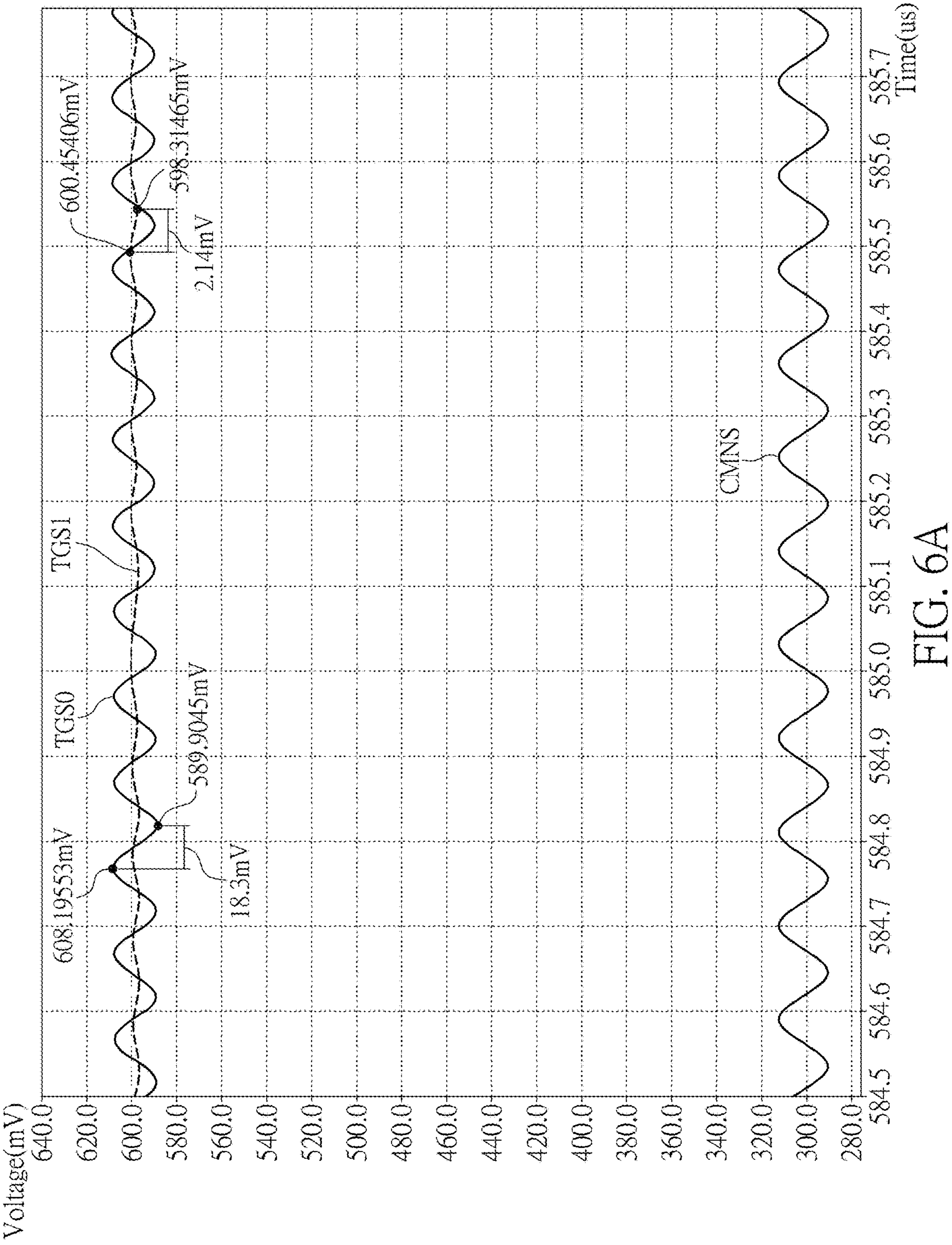

FIG. 6 and FIG. 6A illustrate examples of voltage waveforms of the optical sensor of the first and second embodiments of the present disclosure and a conventional optical sensor.

For example, a common mode voltage of a common-mode noise signal CMNS may have an average voltage value of 0.3 V, a voltage variance of 10 mV, varying at a frequency of 10 MHZ.

In the conventional optical sensor, a current integrator only includes a single output terminal, and only includes one capacitor and one switch that are connected between a first input terminal (such as inverting input terminal) and the single output terminal of the conventional optical sensor.

Therefore, as shown in FIG. 6, when the conventional optical sensor senses light, the conventional optical sensor outputs a voltage output signal TGS0 that only includes positive voltages but does not include negative voltages. Furthermore, the positive voltage output signal TGS0 outputted by the current integrator of the conventional optical sensor only falls within a small voltage range.

In contrast, as shown in FIG. 1 and FIG. 3, the differential current integrator DCI outputs a first output voltage signal Vout1 and a second output voltage signal Vout2. Therefore, when the optical sensor of the present disclosure senses light, the optical sensor of the present disclosure outputs a voltage output signal TGS1. The voltage output signal TGS1 may be the first voltage difference Vd1.

$$Vd1 = Vout1 - Vout2 = 2 \times \frac{1}{CT} \int Iph\, dt$$

The voltage output signal TGS1 outputted by the optical sensor of the present disclosure falls within a voltage range being larger than the voltage range of the positive voltage output signal TGS0 outputted by the current integrator of the conventional optical sensor. For example, the voltage range of the voltage output signal TGS1 may be twice larger than the voltage range of the positive voltage output signal TGS0.

Furthermore, common-mode noise signal CMNS may be applied at the inputs of the optical sensor. As shown in FIG. 6A, the voltage output signal TGS1 varies within a range of a peak value "600.45406 mV" to a valley value "598.31465 mV". Accordingly, a variation of the voltage output signal TGS1 is only about 2.14 mV.

In contrast, the voltage output signal TGS0 varies within a range of a peak value "608.19553 mV" to a valley value "589.9045 mV". Accordingly, a variation of the voltage output signal TGS0 reaches a voltage of 18.3 mV.

Therefore, the optical sensor of the present disclosure has higher immunity to common-mode noise than that of the conventional optical sensor. As a result, the optical sensor of the present disclosure is capable of more precisely sensing the light intensity of light than the conventional optical sensor.

Figure 7:
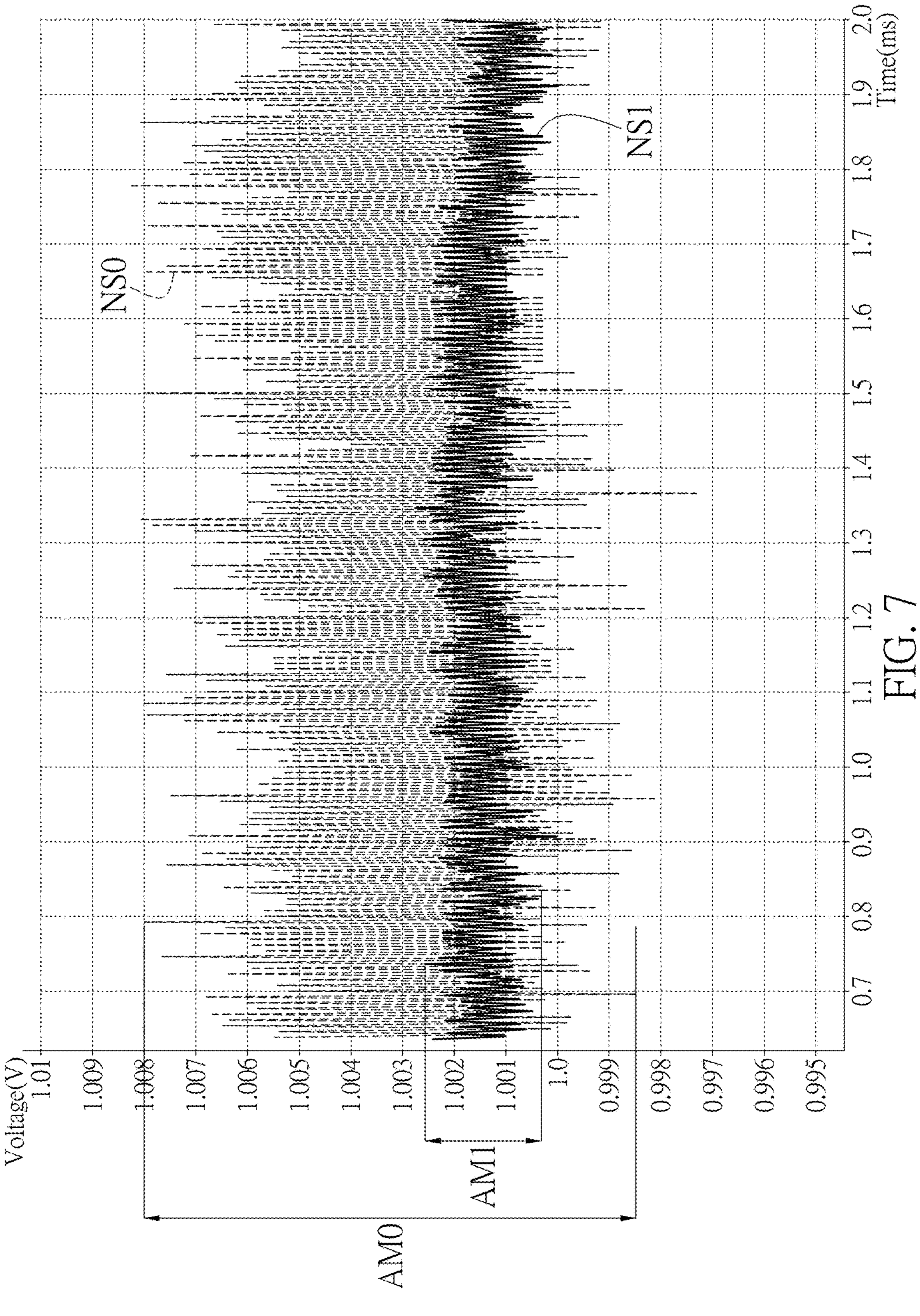
FIG. 7 illustrates examples of waveforms of noise signals of the optical sensor of the second embodiment of the present disclosure.

FIG. 7 illustrates examples of waveforms of noise signals of the optical sensor of the second embodiment of the present disclosure.

FIG. 7 illustrates examples of noise signal NS1 and NS0. The noise signal NS1 is the noise at the outputs of the differential current integrator DCI in the case where the first reference voltage Vref1 is zero. In other words, the node of the first reference voltage Vref1 is connected to ground. The noise signal NS0 is the noise at the outputs of the differential current integrator DCI in the case where the first reference voltage Vref1 is generated by another analog reference buffer circuit. The another analog reference buffer circuit supplies a non-zero voltage to the differential current integrator DCI. As shown in FIG. 7, a variance AM1 of the noise signal NS1 is much smaller than a variance AM0 of the noise signal NS0. It is apparent that, the noise generated by the optical sensor of the present disclosure is significantly reduced when the first reference voltage Vref1 is zero. Additionally, reducing the first reference voltage Vref1 to a low voltage may reduce the dark current of the photodiode PD.

In conclusion, the optical sensor of the present disclosure is capable of sensing light to generate the first output voltage signal Vout1 and the second output voltage signal Vout2 in order to suppress the common-mode noise introduced in the first and second output terminals of the differential current integrator. The optical sensor of the present disclosure may output the voltage output signal TGS1 based on the output voltage signals Vout1 and Vout2. The voltage output signal TGS1 has a wider voltage range than the voltage range of the voltage output signal TGS0 of the conventional optical sensor.

The foregoing description of the exemplary embodiments of the disclosure includes been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical sensor, comprising:

a photodiode;

a differential current integrator including a first input terminal, a second input terminal, a first output terminal and a second output terminal, wherein the first input terminal of the differential current integrator is connected to the photodiode, and the second input terminal of the differential current integrator is coupled to a first reference voltage;

a first input current source, wherein a first terminal of the first input current source is coupled to a common voltage; and a first power switch, wherein a first terminal of the first power switch is connected to a second terminal of the first input current source, and a second terminal of the first power switch is connected to the first input terminal of the differential current integrator.

2. The optical sensor according to claim 1, further comprising:

a first current source connected to the differential current integrator.

3. The optical sensor according to claim 2, wherein the first current source is connected to the first input terminal of the differential current integrator.

4. The optical sensor according to claim 3, further comprising:

a first switch connected between the first current source and the first input terminal of the differential current integrator.

5. The optical sensor according to claim 2, wherein the first current source is connected to the second input terminal of the differential current integrator.

6. The optical sensor according to claim 5, further comprising:

a first switch connected between the first current source and the second input terminal of the differential current integrator.

7. The optical sensor according to claim 6, further comprising:

a second switch connected between the first reference voltage and the first input terminal of the differential current integrator.

8. The optical sensor according to claim 7, further comprising:

a third switch connected between the first reference voltage and the second input terminal of the differential current integrator.

9. The optical sensor according to claim 8, wherein the first reference voltage is zero.

10. The optical sensor according to claim 1, further comprising:

a first voltage comparator, wherein a first input terminal of the first voltage comparator is connected to the second output terminal of the differential current integrator, a second input terminal of the first voltage comparator is connected to the first output terminal of the differential current integrator, a third input terminal of the first voltage comparator is coupled to a second reference voltage, and a fourth input terminal of the first voltage comparator is coupled to a third reference voltage.

11. The optical sensor according to claim 10, further comprising:

a second voltage comparator, wherein a first input terminal of the second voltage comparator is connected to the second output terminal of the differential current integrator, a second input terminal of the second voltage comparator is connected to the first output terminal of the differential current integrator, a third input terminal of the second voltage comparator is coupled to the third reference voltage, and a fourth input terminal of the second voltage comparator is coupled to the second reference voltage.

12. The optical sensor according to claim 1, wherein the differential current integrator comprises:

an operational amplifier having an inverting input terminal, a non-inverting input terminal, a first output terminal and a second output terminal, wherein the inverting input terminal is connected to the first input terminal of the differential current integrator, the non-inverting input terminal is connected to the second input terminal of the differential current integrator, the first output terminal of the operational amplifier is connected to the first output terminal of the differential current integrator, and the second output terminal of the operational amplifier is connected to the second output terminal of the differential current integrator;

a first integrating capacitor connected between the first input terminal and the first output terminal of the differential current integrator; and a second integrating capacitor connected between the second input terminal and the second output terminal of the differential current integrator.

13. The optical sensor according to claim 12, wherein the differential current integrator comprises:

a first reset switch, wherein a first terminal of the first reset switch is connected to the first input terminal of the differential current integrator, and a second terminal of the first reset switch is connected to the second input terminal of the differential current integrator; and a second reset switch, wherein a first terminal of the second reset switch is connected to the first output terminal of the differential current integrator, and a second terminal of the second reset switch is connected to the second output terminal of the differential current integrator.

14. The optical sensor according to claim 1, further comprising:

a photodiode current switch connected between the photodiode and the first input terminal of the differential current integrator.

15. The optical sensor according to claim 1, further comprising:

a second input current source, wherein a first terminal of the second input current source is coupled to the common voltage; and a second power switch, wherein a first terminal of the second power switch is connected to a second terminal of the second input current source, and a second terminal of the second power switch is connected to the first input terminal of the differential current integrator.

16. An optical sensor, comprising:

a photodiode;

a differential current integrator including a first input terminal, a second input terminal, a first output terminal and a second output terminal, wherein the first input terminal of the differential current integrator is connected to the photodiode, and the second input terminal of the differential current integrator is coupled to a first reference voltage; and a first voltage comparator, wherein a first input terminal of the first voltage comparator is connected to the second output terminal of the differential current integrator, a second input terminal of the first voltage comparator is connected to the first output terminal of the differential current integrator, a third input terminal of the first voltage comparator is coupled to a second reference voltage, and a fourth input terminal of the first voltage comparator is coupled to a third reference voltage.

17. The optical sensor according to claim 16, further comprising:

a second voltage comparator, wherein a first input terminal of the second voltage comparator is connected to the second output terminal of the differential current integrator, a second input terminal of the second voltage comparator is connected to the first output terminal of the differential current integrator, a third input terminal of the second voltage comparator is coupled to the third reference voltage, and a fourth input terminal of the second voltage comparator is coupled to the second reference voltage.

18. An optical sensor, comprising:

a photodiode;

a differential current integrator including a first input terminal, a second input terminal, a first output terminal and a second output terminal, wherein the first input terminal of the differential current integrator is connected to the photodiode, and the second input terminal of the differential current integrator is coupled to a first reference voltage;

a first current source connected to the differential current integrator;

a first switch connected between the first current source and the second input terminal of the differential current integrator; and a second switch connected between the first reference voltage and the first input terminal of the differential current integrator.

19. The optical sensor according to claim 18, further comprising:

a third switch connected between the first reference voltage and the second input terminal of the differential current integrator.

* * * * *